US009607937B2

(12) United States Patent
Watts et al.

(10) Patent No.: US 9,607,937 B2
(45) Date of Patent: Mar. 28, 2017

(54) PIN GRID INTERPOSER

(75) Inventors: Nicholas R. Watts, Phoenix, AZ (US); Tao Wu, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 91 days.

(21) Appl. No.: 13/976,194

(22) PCT Filed: Dec. 19, 2011

(86) PCT No.: PCT/US2011/065905
§ 371 (c)(1),
(2), (4) Date: Jun. 26, 2013

(87) PCT Pub. No.: WO2013/095339
PCT Pub. Date: Jun. 27, 2013

(65) Prior Publication Data
US 2013/0285242 A1 Oct. 31, 2013

(51) Int. Cl.
*H01L 25/065* (2006.01)
*H01L 25/11* (2006.01)
(Continued)

(52) U.S. Cl.
CPC ...... *H01L 23/49816* (2013.01); *H01L 23/488* (2013.01); *H01L 23/49811* (2013.01);
(Continued)

(58) Field of Classification Search
CPC ..... H01L 25/117; H01L 25/162; H01L 23/32; H01L 23/49822; H01L 23/5383;
(Continued)

(56) References Cited

U.S. PATENT DOCUMENTS 5,400,950 A 3/1995 Myers et al.
8,031,474 B2 10/2011 Ogawa et al.
(Continued)

FOREIGN PATENT DOCUMENTS

CN 101022698 A 8/2007
KR 2008-0093910 10/2008
(Continued)

OTHER PUBLICATIONS

NPL1: Sep. 4, 2010 version of <http://en.wikipedia.org/wiki/Solder_mask>.*
NPL2: Nov. 27, 2010 version of <http://www.radio-electronics.com/info/manufacture/soldering/soldering-process/solder-resist.php>.*
International Search Report and Written Opinion mailed Sep. 24, 2012 for PCT/US2011/065905 filed Dec. 19, 2011, 11 pages.
(Continued)

*Primary Examiner* — Zandra Smith
*Assistant Examiner* — Molly Reida
(74) *Attorney, Agent, or Firm* — Blakely, Sokoloff, Taylor & Zafman LLP

(57) ABSTRACT

An interposer to form a frame around a bottom chip bonded to a package substrate and to standoff a top chip or package for clearance of the bottom chip. The interposer has pins arrayed on a first side which are soldered to the package substrate for reduced interposer z-height and pads arrayed on a second side to which the top package (chip) is bonded. During assembly, the interposer pins may be pressed against pre-soldered pads and the solder reflowed to join the interposer to the package substrate. A top package (chip) is then joined to an opposite side of the interposer to integrate the first and second chips.

22 Claims, 6 Drawing Sheets

(51) Int. Cl.
    H01L 23/488    (2006.01)
    H01L 23/12     (2006.01)
    H01L 23/498    (2006.01)
    H01L 25/10     (2006.01)
    H01L 25/00     (2006.01)
    H01L 23/00     (2006.01)

(52) U.S. Cl.
    CPC .. *H01L 23/49827* (2013.01); *H01L 23/49833* (2013.01); *H01L 24/81* (2013.01); *H01L 25/0657* (2013.01); *H01L 25/105* (2013.01); *H01L 25/50* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/13147* (2013.01); *H01L 2224/16225* (2013.01); *H01L 2224/16235* (2013.01); *H01L 2224/32225* (2013.01); *H01L 2224/73204* (2013.01); *H01L 2224/81815* (2013.01); *H01L 2224/92125* (2013.01); *H01L 2225/06517* (2013.01); *H01L 2225/1023* (2013.01); *H01L 2225/1058* (2013.01); *H01L 2225/1088* (2013.01); *H01L 2924/1431* (2013.01); *H01L 2924/1434* (2013.01); *H01L 2924/1436* (2013.01); *H01L 2924/1437* (2013.01); *H01L 2924/1443* (2013.01); *H01L 2924/15311* (2013.01); *H01L 2924/15331* (2013.01); *H01L 2924/181* (2013.01)

(58) Field of Classification Search
    CPC ......... H05K 7/023; H05K 2201/10378; H05K 2201/10515
    See application file for complete search history.

(56) References Cited

U.S. PATENT DOCUMENTS

| | | |
|---|---|---|
| 2005/0006442 A1 | 1/2005 | Stillabower |
| 2005/0181544 A1* | 8/2005 | Haba et al. ................... 438/127 |
| 2007/0176613 A1* | 8/2007 | Ogawa ................... G02B 6/138 361/760 |
| 2008/0150113 A1 | 6/2008 | Haba et al. |
| 2008/0257596 A1 | 10/2008 | Kaneko |
| 2009/0166835 A1 | 7/2009 | Yang et al. |
| 2011/0285014 A1 | 11/2011 | Shen et al. |
| 2013/0271907 A1* | 10/2013 | Mortensen et al. ..... 361/679.02 |

FOREIGN PATENT DOCUMENTS

| | | |
|---|---|---|
| KR | 10-2009-0072958 | 7/2009 |
| KR | 2009-0072958 | 7/2009 |

OTHER PUBLICATIONS

International Preliminary Report on Patentability (Ch. I of the PCT) in PCT Application No. PCT/US2011/065905, dated Jun. 24, 2014; 6pgs.
Notice of Preliminary Rejection (Non-Final) from the Korean Intellectual Property Office (KIPO) dated Jul. 24, 2015 for Korean Patent Application No. 2014-701-7016589, 12 pages and summary thereof.
Korean Office Action dated Dec. 22, 2015 for corresponding Korean Patent Application No. 2014-7016589.
Korean Office Action dated Jun. 28, 2016; Korean Patent Application No. 2014-7016589; (4 pages).
Chinese Office Action dated May 31, 2016; Chinese Patent Application No. 2011-80075618.9 (7 pages).
Notice of Allowance—Chinese Patent Application No. 201180075618.9; dated Nov. 15, 2016, 4 pages.

* cited by examiner

PIN GRID INTERPOSER

CROSS-REFERENCE TO RELEATED APPLICATION

This application is a U.S. National Phase application under 35 U.S.C. §371 of International Application No. PCT/US2011/065905, filed Dec. 19, 2011, entitled PIN GRID INTERPOSER.

TECHNICAL FIELD

Embodiments of the invention are generally related to stacked-package assemblies, and more particularly pertain to interposers for multi-chip package assemblies.

BACKGROUND

While monolithic integration of circuits continues to evolve, integration of separate integrated circuit (IC) chips provides advantageous product flexibility. Many techniques are employed to integrate a first IC chip, such as a memory chip, with a second IC chip, such as a logic or processor chip, with the general goals typically including lower cost and higher component density. One technique is "stacked-die" packages where one chip is stacked on another, and the two die are then packaged together on a substrate. Another technique is "package on package" (PoP) where two ball grid array (BGA) packages are installed atop each other with an interface to route signals between them.

While conventional PoP offers the advantage of functionally decoupling the packaged chips from one another, PoP imposes a z-height limitation the bottom package (PoPb). This limitation can be seen in FIG. 1 illustrating a conventional PoP assembly 100 including a top package 101 stacked upon a bottom package 105. As shown, the BGA interconnects 115 limit the bottom package 105 to a maximum z-height of $H_1$.

As there are a limited number of standardized solder ball dimensions, a packaged chip having a z-height ($H_2$) that exceeds $H_1$ provided by the largest available BGA interconnect cannot be utilized as the bottom package (chip) in the conventional PoP assembly process because interference between the top and bottom packages (chips) would hinder electrical interconnection by BGA interconnects 115. Even where the bottom package 105 includes a flip-chip architecture, the largest chips, such as microprocessor chips, may have a chip thickness that causes the z-height $H_2$ to exceed $H_1$. As such, advantageous package-level chip integrations are hindered by conventional PoP architectures.

PoP architectures and techniques which allow bottom packages to have a greater z-height and a greater resolution of z-height offer advantageous flexibility to accommodate bottom packages of any z-height.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1:
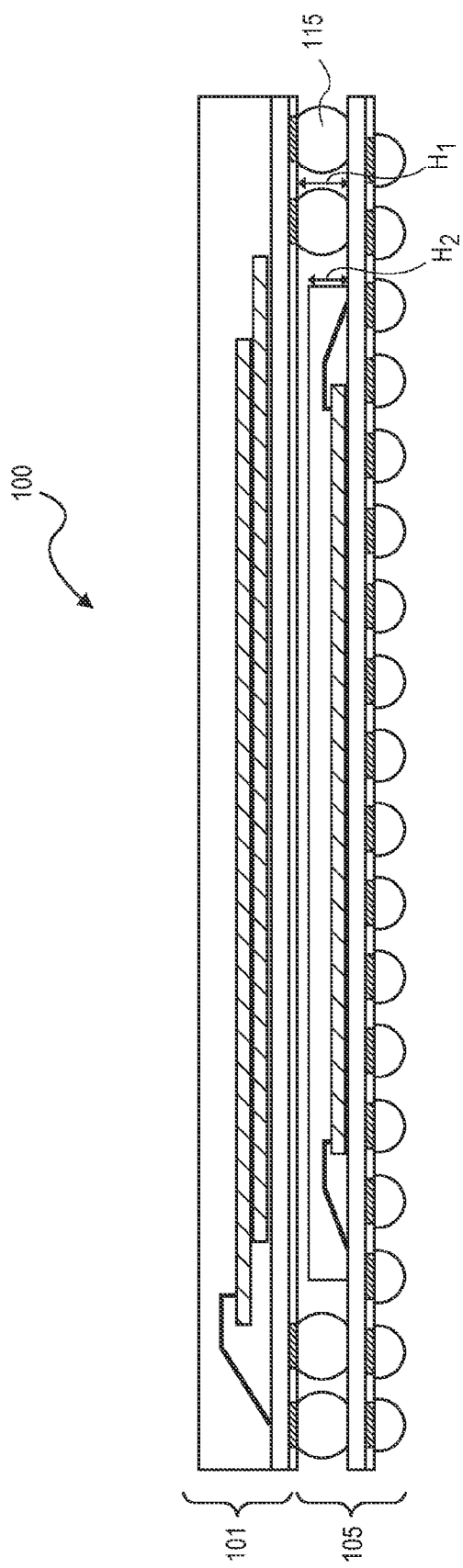
FIG. 1 illustrates a conventional PoP assembly.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" my be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Described herein are embodiments of an interposer that is to form a frame, or ring, around a bottom (first) chip bonded to a package substrate and is to standoff a top (second) package or chip for clearance of the bottom chip. The interposer is referred to herein as a "Pin Grid Interposer" (PGI) because the interposer has pins on a first side, which in the exemplary embodiment are arrayed in a grid pattern. The pins are soldered to the package substrate for reduced interposer z-height, and greater control of z-height, relative to a collapsed height of a ball grid array (BGA) interconnect architecture. Because embodiments of the interposer pins are plated-up, similar to bumps or posts on a chip employed in a flip-chip or Controlled Collapse Chip Connection (C4) process, the pin z-height may be controlled to sub-micron precision and many assembly techniques developed for C4 may be utilized to attach the interposer to a substrate in preparation for bonding of a second package (chip) to pads on a second side of the interposer. For example, during assembly, the interposer pins may be pressed against pre-soldered pads on the package substrate for a collapse controlled by one or more of a solder mask thickness, a plated pin height or a pre-solder thickness.

Figure 2:
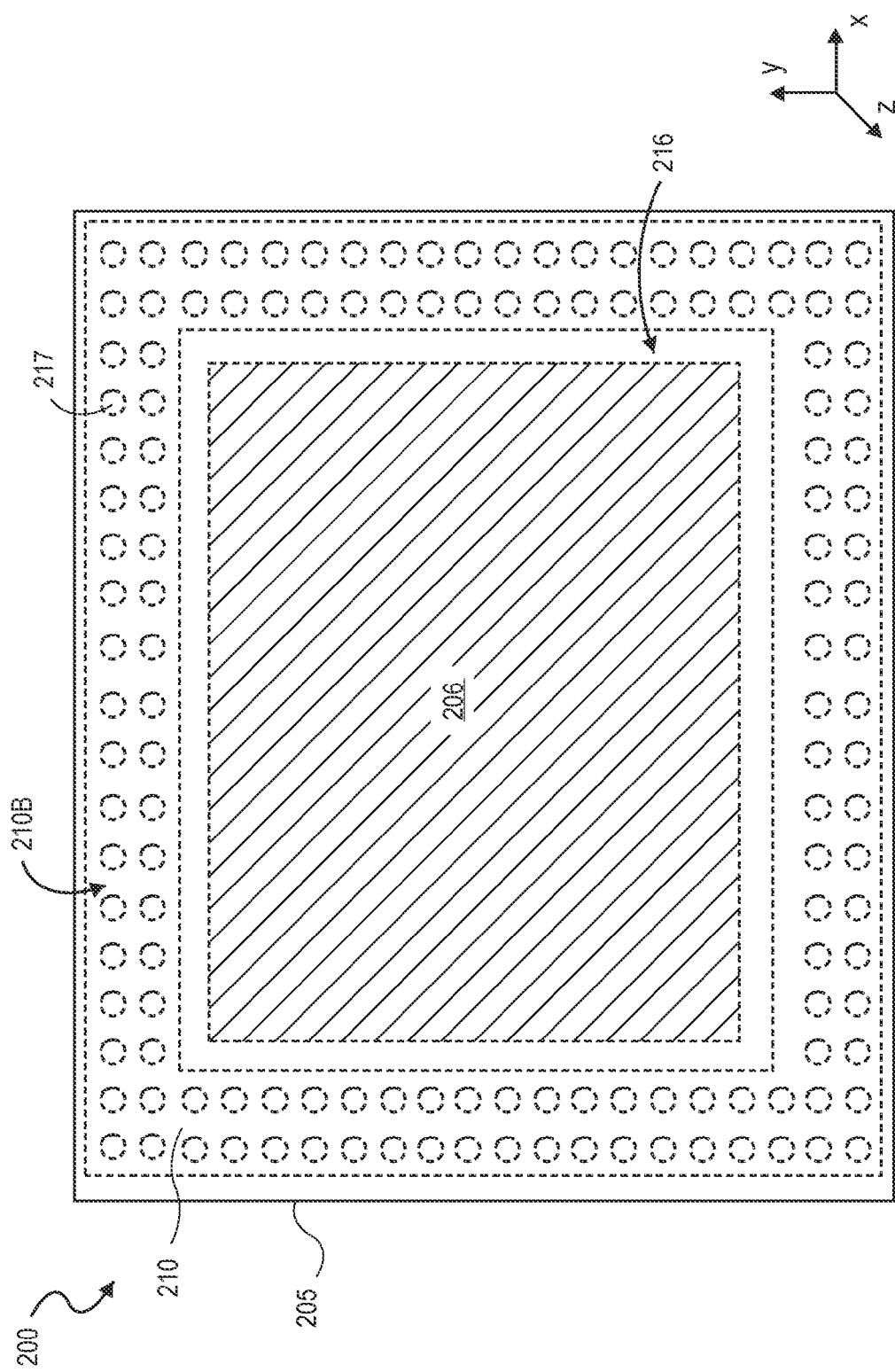
FIG. 2 illustrates a bottom side plan view of a Pin Grid Interposer (PGI), in accordance with an embodiment.

FIG. 2 illustrates a plan view of a Pin Grid Interposer (PGI) 210, in accordance with an embodiment. FIG. 2 provides a view of a first side of the PGI 210, referred to herein as the PGI bottom side 210B, looking through a package substrate 205 to which the PGI 210 is bonded. The PGI 210 includes a cut-out 216 into which a bottom chip 206 that is bonded to the package substrate 205 is disposed. Generally, the bottom chip 206 may functionally be any type of IC, but in the exemplary embodiment the bottom chip 206 is a logic chip, such as, but not limited to, a microprocessor, a digital signal processor, or a graphics processor. The layout dimensions of the PGI 210 may therefore vary as a function of the area of the bottom chip 206 with sides of the PGI 210 being on the millimeter scale and of sufficient length to provide for adequate alignment tolerances.

The PGI 210 forms a contiguous frame surrounding edges of the bottom chip 206 and in the exemplary embodiment, the cut-out 216 forms a substantially square window. As illustrated, the PGI bottom side 210B includes a plurality of pins 217. In the exemplary embodiment, the pins 217 form a 2×N pin grid array along each side of the PGI 210, though other pin counts and arrangements (e.g., staggered) are possible as a matter of design choice and surface area of the PGI bottom side 210B.

Figure 3A:
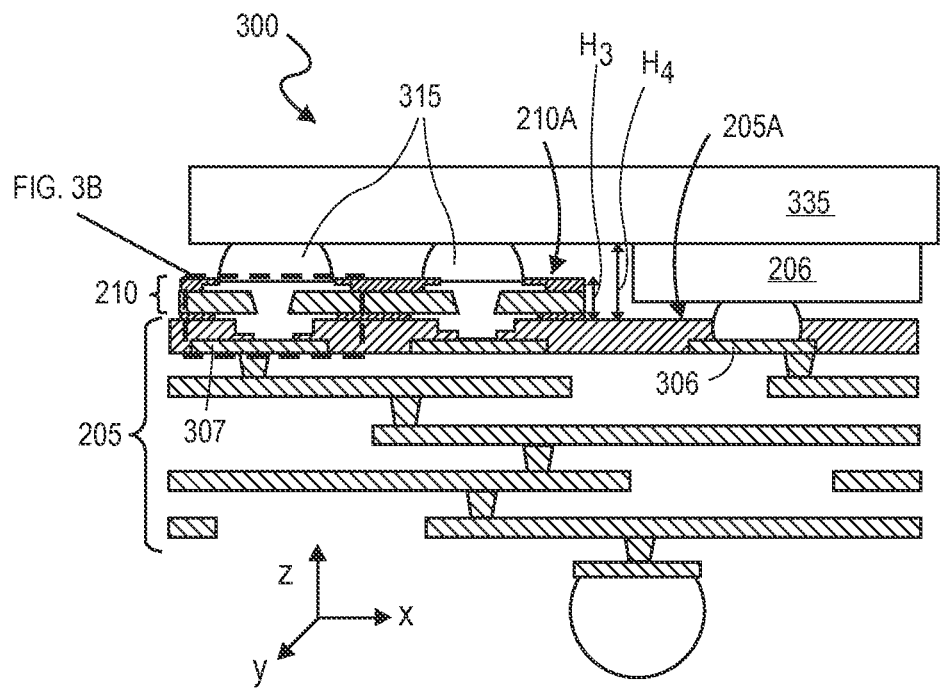
FIG. 3A illustrates a side view of a cross section through a stacked-package assembly employing the PGI illustrated in FIG. 1, in accordance with an embodiment.

FIG. 3A illustrates a side view of a cross section through one side of a stacked-package assembly 300 employing the PGI 210 illustrated in FIG. 2, in accordance with an embodiment. As shown, the bottom chip 206 is electrically coupled to first interconnect pads 306 disposed on a first side of the package substrate 205, referred to herein as the package substrate top side 205A. The package substrate 205 may comprise any conventional package technology, such as a plurality of organic build-up layers disposed on opposite sides of a resin core with one or more levels of plated interconnects (e.g., six-levels of interconnect are depicted in FIG. 3A). In other embodiments, the package substrate 205 may comprise a coreless architecture where organic layers are built-up on an adhesive binder and/or directly on the bottom chip 206. Depending on the application, the package substrate 205 may be attached to a printed circuit board (PCB), or other substrate known in the art.

The first interconnect pads 306 may be coupled to the bottom chip 206 in any manner conventional in the art. In the exemplary embodiment, the bottom chip 206 is flip-chip bonded to the package substrate 205 with bumps (not illustrated) projecting from a top side (i.e., front side active, thin film side, IC side, etc.) of the bottom chip 206 soldered to the first interconnect pads 306. Exemplary top side bumps are between 75 µm and 100 µm. In other embodiments, the bottom chip may be coupled to the package substrate 205 through BGA interconnects.

The PGI 210 electrically coupled to second interconnect pads 307 and disposed adjacent to a sidewall of the bottom chip 206. In the illustrative embodiment, the second interconnect pads 307 are disposed on package substrate top side 205A to form an outer perimeter surrounding the first interconnect pads 306 with the second interconnect pads 307 arrayed to correspond to the layout of the pins 217.

The PGI 210 has a side opposite the package substrate, referred to herein as the PGI topside 210A, that defines a PGI z-height $H_3$ as measured from the package substrate top side 205A. The PGI z-height $H_3$ is a function of the thickness of the PGI 210 and also the collapse of the interconnect between the PGI 210 and the package substrate 205. In the exemplary embodiment, the z-height $H_3$ is less than a z-height $H_4$ as measured from a backside of the bottom chip 206 to the package substrate top side 205A. Advantageously, the difference between the z-height $H_3$ and the z-height $H_4$ is just sufficient for the interconnect between the PGI 210 and a top (second) chip 335. For the exemplary embodiment utilizing a flip chip bonded bottom chip 206, the z-height $H_3$ is advantageously reduced to provide a minimal standoff for clearance between the bottom chip 206 and the top package 335. Depending on the thickness of the bottom chip 206, $H_4$ may be between 80 µm and 150 µm. For certain such embodiments, the PGI 210 provides a corresponding z-height $H_3$ that is less than 150 µm and advantageously between 90 µm and 125 µm.

In the exemplary embodiment, the top package 335 is electrically coupled to the PGI 210 through interconnects 315. The top package 335, like the bottom chip 206, may functionally include any type of IC chip, however in the exemplary embodiment where the bottom chip 206 is a logic device (e.g., a microprocessor), the top package 335 includes a memory chip, such as but not limited to a static random access memory (SRAM), a dynamic access memory (DRAM), a nonvolatile memory (NVM), phase change memory (PCM), or the like. In the exemplary embodiment, the top package 335 further includes a mold, and multiple chips may also be included in the top package 335.

Generally, the top package 335 may be coupled to the PGI 210 in any manner conventional in the art. Depending on the implementation, the top package 335 may include a separate package substrate, or may be an unpackaged die prior to assembly onto the PGI 210. In the depicted embodiment, the interconnects 315 comprise a BGA with solder balls disposed on the top package 335 (e.g., disposed on a package substrate of the top package 335) collapsing in contact with pads on the PGI 210 until top package 335 (e.g., top side) contacts the bottom chip 206 (e.g., bottom side). In an alternate embodiment the top package 335 is flip-chip bonded to the PGI 210 with bumps projecting from a top side of the top package 335 soldered to pads disposed on the PGI 210.

Figure 3B:
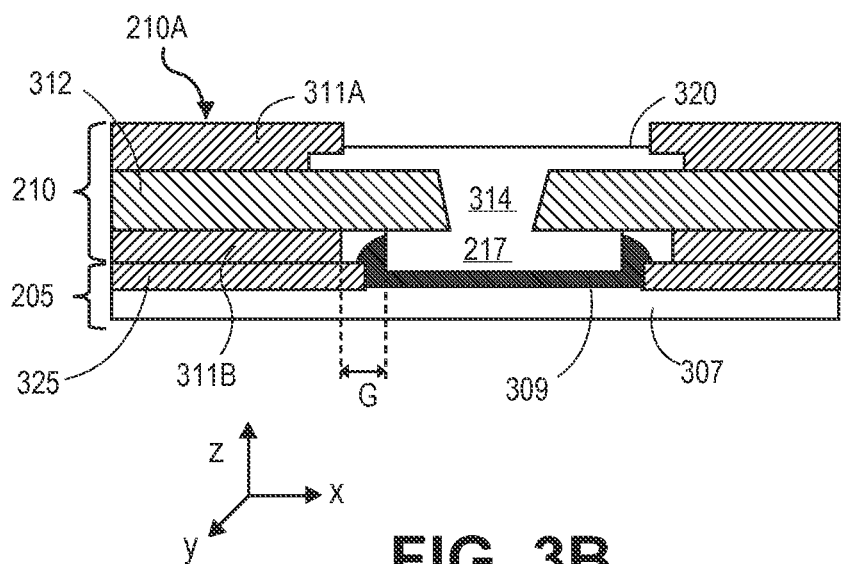
FIG. 3B illustrates an expanded side view of a cross section through assembly illustrated in FIG. 3A, in accordance with an embodiment.

FIG. 3B illustrates an expanded side view of the dashed box region illustrated in FIG. 3A, in accordance with an embodiment. As illustrated, the PGI 210 includes third interconnect pads 320 on the PGI topside 210A to which the top package 335 is to be coupled. A dielectric layer 311A disposed over a PGI substrate 312 surrounding the third interconnect pads 320. In embodiments, the PGI substrate 312 is a conventional organic package resin core. While the dielectric layer 311A may be any conventional thin film or organic build up layer know in the art, in the exemplary embodiment, the dielectric layer 311A is a solder resist forming a solder mask around the third interconnect pads 320.

FIG. 3B further depicts one of the pins 217 projecting from the PGI bottom side 210B. For purposes herein, all pins 217 are substantially the same with respect to the structural features highlighted herein. As shown, the pins 217 are electrically coupled through the PGI substrate 312 to a third interconnect pad 320. In the exemplary embodiment, the pins 217 comprise copper electrically coupled to a copper filled through via 314. Disposed around the pins 217 is a dielectric layer 311B disposed over the PGI substrate 312. While the dielectric layer 311B may again be any conventional organic build up layer know in the art, in the exemplary embodiment, the dielectric layer 311B is a solder resist forming a solder mask around the pins 217. Unlike the third interconnect pad 320, the pins 217 are metal-defined with a gap G between the pins 217 and the dielectric layer 311B. While the gap G may vary with implementation, in exemplary embodiments the gap G is between 50 and 125 µm.

FIG. 3B illustrates the stacked-package assembly 300 following solder reflow, with the pins 217 electrically coupled and physically joined to the second interconnect pads 307 by the solder 309. Solder 309 wicks up the pins 217 so the joint forms a slender column surrounding sidewalls of the pins 217 and filling into the gap G to enable additional collapse in the z-dimension relative to BGA solder ball, for example.

Figure 4:
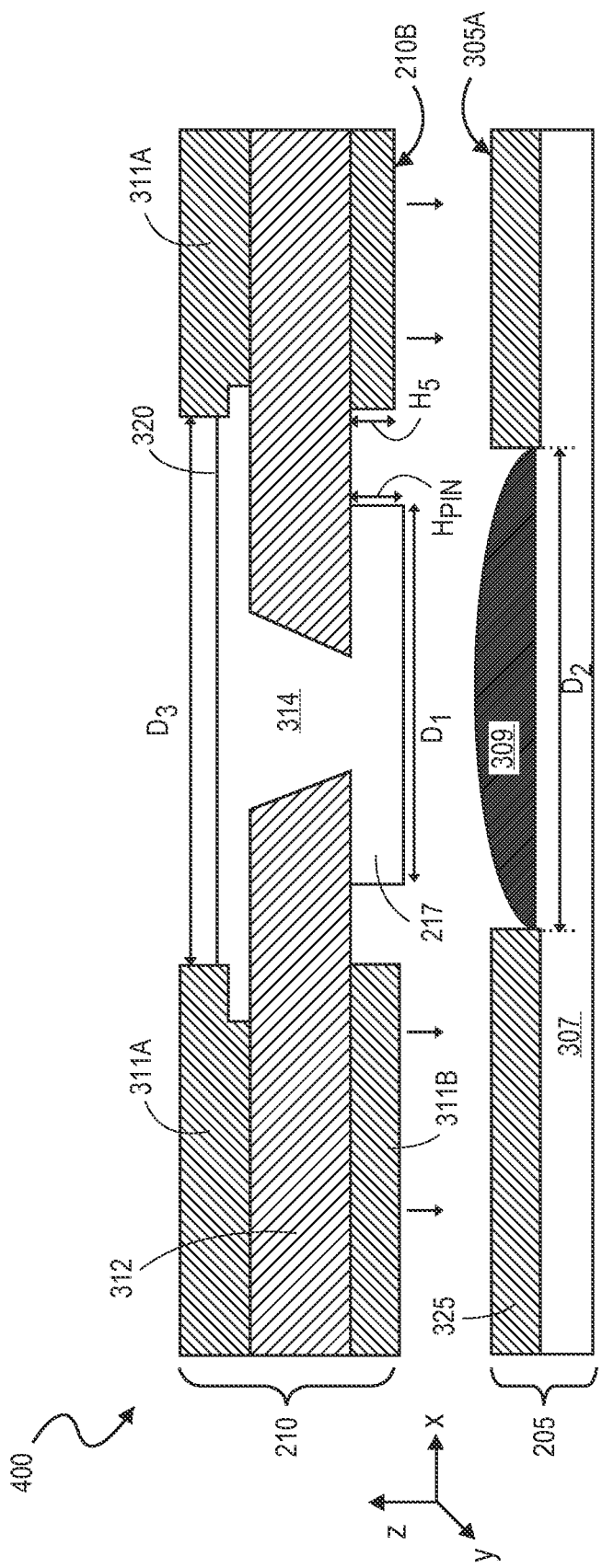
FIG. 4 illustrates an side view of a cross-section through a PGI and package substrate before assembly, in accordance with an embodiment.

FIG. 4 illustrates an side view of a cross-section through a portion of the PGI 210 and the package substrate 205 corresponding to that illustrated in FIG. 3B, but prior to their attachment to form assembly 400, in accordance with an embodiment. In the exemplary embodiment, the PGI 210 includes only through vias 314 directly connecting each interconnect pad 320 to a corresponding one of the pins 217. In other embodiments where a larger standoff is desired/permitted, additional interconnect layers within the PGI 210 may provide routing between interconnect pads 320 and/or pins 217.

As shown in FIG. 4, the pins 217 have a diameter $D_1$ and extend in the z-dimension from the PGI substrate 312 by a z-height $H_{Pin}$ (i.e., pin sidewall z-height). Notably, $H_{Pin}$ may be well controlled as a function of plating (e.g., to form a copper stud or post of a given z-height and to form a desired surface finish that will be compatible with the alloy chosen for solder 309). While dimensions of the pins 217 may vary with the implementation, in exemplary embodiments $D_1$ is between 150 µm and 300 µm (somewhat larger than a C4 plated bump or post utilized for interconnect of the bottom chip 206 to first interconnect pads 306) and $H_{Pin}$ is between 20 µm and 50 µm.

Adjacent to the pins 217 is the dielectric layer 311B having a thickness (i.e., sidewall height) $H_5$. On the package substrate 205, the dielectric layer 325 forms an opposing mating surface 305A to the dielectric layer 311B. In embodiments, at least one or more of the dielectric layer 311B, the dielectric layer 325, and the pins 217 define a collapsed z-height of the joint between the PGI 210 and package substrate 205. For the exemplary embodiment (illustrated FIG. 3B), contact between the dielectric layers 311B and 325 controls the collapsed z-height of the interconnect so that the PGI 210 provides a well-controlled and minimal z-height $H_3$ which does not require any underfill. Such collapse control is facilitated by the pins 217 being of a well-controlled z-height, as plated, and the dielectric layers 311B and 325 having predetermined as-deposited thickness, compressibility during PGI attachment and shrinkage during solder reflow (leading to predictable collapse of the thickness $H_5$).

In the exemplary embodiment illustrated in FIG. 4, the package substrate 205 includes the solder 309 prior to assembly with the PGI 210. A thickness of pre-solder is disposed within the recess formed by the dielectric layer 325. While the pre-solder thickness may vary with implementation, in advantageous embodiments, the solder 309 has a maximum z-height that extends beyond the top surface of the dielectric layer 325 (e.g., 5-35 µm beyond solder mask prior to assembly). The dielectric layer 311B may therefore have a thickness $H_5$ that depends on the pre-solder thickness and $H_{Pin}$, to ensure sufficient contact between the pins 217 and solder 309 upon assembly.

In the exemplary embodiment, the dielectric layer 325 (e.g., solder resist) defines an exposed portion of the second interconnect pads 307 having a diameter $D_2$. Generally, the pad diameter $D_2$ is larger than a diameter $D_1$ of the pins 217. For example, the diameter $D_2$ may be 30% to 60% larger than the diameter $D_1$. Similarly, the dielectric layer 311A (e.g., solder resist) defines an exposed portion the third interconnect pads 320 having a pad diameter $D_3$. Depending on the implementation, surface finish on the third interconnect pads 320 may also have the pad diameter $D_3$. Though the pad diameter $D_3$ may vary based on the interconnect technique employed to join the top package 335 to the PGI 210, for exemplary embodiments the pad diameter $D_3$ is approximately (e.g., with 15%) the same as $D_2$, or slightly larger (e.g., less than 25% larger). For the illustrative embodiment, no solder is disposed on the third interconnect pads 320 such that the PGI 210 is solder-free prior to assembly. As illustrated in FIG. 3A therefore, the interconnect 315 sources solder from the top package 335.

Figure 5:
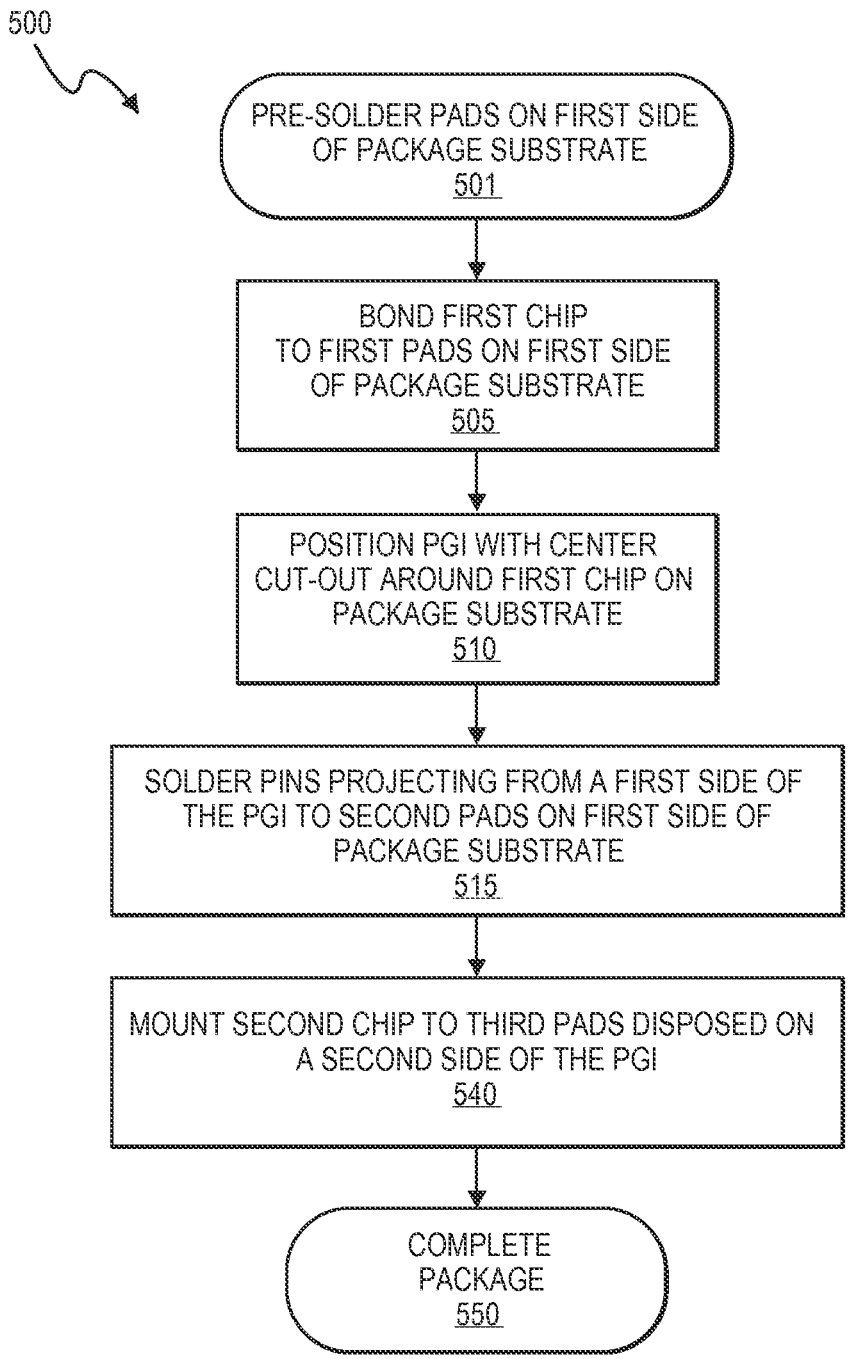
FIG. 5 is a flow diagram illustrating operations for fabricating a PGI and an assembly including the PGI, in accordance with embodiments.

FIG. 5 is a flow diagram illustrating operations in a method 500 for fabricating a PGI and stacked-package assembly 300, in accordance with embodiments. While the operations illustrated in FIG. 5 highlight advantageous embodiment, the depicted operations are not exclusive of other operations and generally include many distinct processes. Except where explicitly stated or implied through a relationship between inputs and outputs of operations, no order is implied by the numbering or relative position of the operations in the flow diagram.

Method 500 begins at operation 501 with pre-soldering pads on the first side of a package substrate. For example, referring to FIG. 4, the solder 309 is disposed on the second interconnect pads 307. In a further embodiment, solder may also be applied to first interconnect pads 306 (FIG. 3A), for example where bumps on the bottom chip 206 comprise a copper post and a surface finish. In other embodiments, pre-solder is performed only on the second interconnect pads 307 in exclusion of the first interconnect pads 306, for example where bumps on the bottom chip 206 include solder.

Continuing with FIG. 5, at operation 505, a first chip is bonded to first interconnect pads on a first side of the package substrate. For example, in one embodiment at operation 505 the bottom chip 206 (FIG. 3A) is flip-chip bonded to the first interconnect pads 306. Next at operation 510, a PGI is positioned relative to a package substrate to align pins on a first side of the PGI with the pre-soldered interconnect pads. As so aligned, the first chip is aligned to be disposed within the cut-out in the PGI. As is shown in FIG. 4, after alignment, the PGI 210 is displaced toward the package substrate 205 to bring the pins 217 in contact with the pre-solder (e.g., solder 309) for PGI attachment by a technique utilized for flip-chip assembly. For example, a non-conductive film (NCF) may be applied to the PGI 210 (or package substrate 205) and an automated bonder attaches the PGI 210 to the package substrate 205. Preferably, during PGI attach, the automated bonder provides sufficient pressure to push the pins 217 into the solder 309. Other alternatives include, but are not limited to, disposing an underfill (UF) or mold compound between PGI 210 and the package substrate 205.

Though operation 510 receives as an input a PGI, embodiments of the present invention also encompass fabrication of the PGI. Generally a PGI may be fabricated using conventional additive and substrative package substrate processing techniques known in the art. In the exemplary embodiment, pins of the PGI (e.g., pins 217) are plated up using conventional copper plating equipment and techniques to control the thickness of the PGI pins to within microns. Known metal definition and solder mask definition techniques, as well as known surface finishing techniques, may all be utilized in the fabrication of the PGI to achieve the architectural/structural characteristics described elsewhere herein.

Returning to FIG. 5, at operation 515, while applying pressure to a PGI and package substrate together, the pre-solder is reflowed to join the PGI to the package substrate. For example, as illustrated in FIG. 3A, pins 217 are pressurized by an NCF and joined to the second interconnect pads 307 by reflow of the solder 309 at operation 510. At this point, the stacked-package assembly 300 lacks only the top package 335 and assembly of the top package 335 may be performed downstream in the supply chain, for example by a vendor customizing an amount of memory to supply with a microprocessor.

Completing the assembly, the method 500 proceeds at operation 540 with mounting of the second chip to pads disposed on a second side of a PGI. With the PGI joined to the package substrate, at operation 540 the assembly is functionally indistinguishable from a conventional PoPb assembly from the standpoint of the PoPt assembler because the PGI presents third interconnect pads having substantially the same characteristics as those on the package substrate to which the first chip is joined. As such, the PGI provides a means of minimally building up an outer perimeter of a package substrate to accommodate clearance of a bottom chip (PoPb). The mounting at operation 540 may therefore proceed in any manner conventional in the art. In one embodiment, solder balls are affixed to a top chip, the solder balls are brought into contact with pads on a PGI and the solder reflowed to join the top chip to the PGI. In another embodiment, solder is affixed to bumps disposed on a front side of a top chip, and the soldered bumps are brought into contact with pads on a PGI. The solder is then reflowed to join the top chip to the PGI in a flip-chip process.

At operation 550, packaging of the assembly is completed, for example one or more of underfill deflux, screen printing, etc. may be performed as known in the art to complete the method 500.

Figure 6:
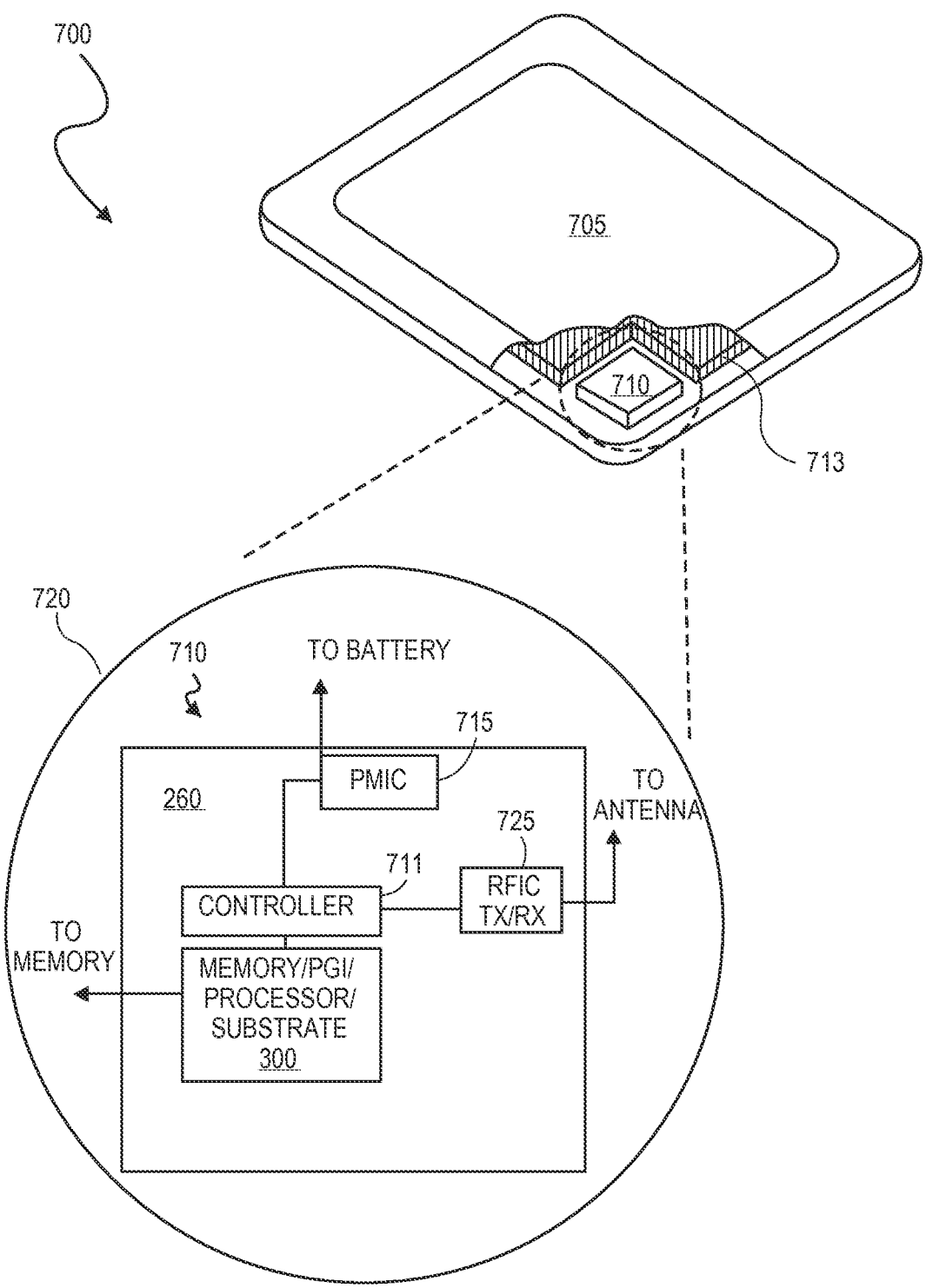
FIG. 6 is a functional block diagram of a mobile computing platform 700 which employs the stacked-package assembly 200, in accordance with an embodiment of the present invention.

FIG. 6 is a functional block diagram of a mobile computing platform 700 which employs the stacked-package assembly 300, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 which in the exemplary embodiment is a touchscreen (capacitive, inductive, resistive, etc.), the board-level integrated system 710, and a battery 713. As illustrated, the greater the level of integration of the board-level integrated system 710, the greater the portion of the mobile computing platform 700 that may be occupied by the battery 713 or non-volatile storage, such as a solid state drive, for greatest platform functionality. As such, the ability to stack a memory chip directly on a processor chip package with a minimal z-height dependent on the z-height of the processor chip as described herein, enables further performance and form factor improvements of the mobile computing platform 700.

The board-level integrated system 710 is further illustrated in the expanded view 720. In the exemplary embodiment, the stacked-package assembly 300 includes at least one memory chip (e.g., RAM), at least one processor chip (e.g., a multi-core microprocessor and/or graphics processor), and a PGI disposed there between, all coupled to the board 260 through a package substrate. Depending on the embodiment, in addition to the stacked-package assembly 300, one or more of a power management integrated circuit (PMIC) 715, RF integrated circuit (RFIC) 725 including an RF transmitter and/or receiver, a controller thereof 711, is on a PCB 260. Functionally, the PMIC 715 performs battery power regulation, DC-to-DC conversion, etc., and so has an input coupled to the battery 713 and has an output provide a current supply to all the other functional modules, including the stacked-package assembly 300. As further illustrated, in the exemplary embodiment the RFIC 725 has an output coupled to an antenna to provide a carrier frequency of around 2 GHz (e.g., a 1.9 GHz in an RFIC 725 designed for 3G or GSM cellular communication) and may further have an input coupled to communication modules on the board-level integrated system 710, such as an RF analog and digital baseband module (not depicted).

The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An integrated circuit (IC) package assembly, comprising:
    a bottom package including a first chip mounted to first interconnect pads on a first side of a bottom package substrate; and
    a pin grid interposer (PGI) forming a frame around the first chip and having pins projecting from a first side, the pins soldered to second interconnect pads disposed on the first side of the bottom package substrate, wherein a first dielectric layer is disposed around the second interconnect pads and a second dielectric layer is disposed over the first side, and wherein the second dielectric layer is spaced apart from a sidewall of at least one of the pins by a gap, and wherein the first dielectric layer contacts the second dielectric layer.

2. The IC package assembly of claim 1, wherein a z-height collapse between the PGI and the bottom package substrate is a function of at least one of a z-height of the pins, a thickness of the first dielectric layer disposed around the second interconnect pads, or a thickness of the second dielectric layer disposed around the pins.

3. The IC package assembly of claim 2, wherein the first dielectric layer comprises first solder resist and the second dielectric layer comprises second solder resist.

4. The IC package assembly of claim 3, wherein the first solder resist defines a surface area for each of the second interconnect pads that is larger than a metal-defined top surface area for each of the pins.

5. The IC package assembly of claim 2, wherein the PGI stands off the bottom package substrate by a z-height which is less than a z-height of the first chip.

6. The IC package assembly of claim 1, wherein the first chip includes bumps projecting from a top side of the first chip soldered to the first interconnect pads, the second interconnect pads forming a perimeter surrounding the first interconnect pads.

7. The IC package assembly of claim 1, wherein the PGI further comprises: third interconnect pads disposed on a second side, the third interconnect pads having areas defined by a third dielectric layer, and ones of the third interconnect pads electrically coupled to ones of the pins.

8. The IC package assembly of claim 7, further comprising a top package including a second chip mounted to the third interconnect pads.

9. The IC package assembly of claim 8, wherein the top package is mounted to the third interconnect pads through a BGA.

10. The IC package assembly of claim 7, wherein the first chip is a microprocessor and wherein the second chip is a memory chip.

11. A pin grid interposer (PGI), comprising:
    a substrate having a cut-out to form a contiguous frame dimensioned to form a perimeter spacer around sides of a first chip;
    a plurality of pins projecting from a first side of the substrate; and
    interconnect pads disposed over a second side of the substrate, ones of the interconnect pads electrically coupled through the substrate to ones of the pins, wherein a first dielectric layer is disposed over the second side of the substrate to define a surface area of at least one of the interconnect pads and wherein a second dielectric layer is disposed over the first side of the substrate and is spaced apart from a sidewall of at least one of the pins by a gap.

12. The PGI of claim 11, wherein the surface area for at least one of the interconnect pads is larger than the top surface area of at least one of the pins.

13. The PGI of claim 11, wherein the pins project from the first side by at least 10 μm beyond a top surface of the second dielectric layer.

14. The PGI of claim 11, wherein the pins have a diameter of less than 250 μm.

15. An integrated circuit (IC) package assembly method, comprising:
    positioning a first chip within a cut-out in a pin grid interposer (PGI), the first chip coupled to first interconnect pads on a first side of a package substrate; and
    soldering pins projecting from a first side of the PGI to second interconnect pads disposed upon the first side of the package substrate, wherein a first dielectric layer is disposed around the second interconnect pads and a second dielectric layer is disposed over the first side of the PGI, and wherein the second dielectric layer is spaced apart from a sidewall of at least one of the pins by a gap, and wherein the first dielectric layer contacts the second dielectric layer after the soldering.

16. The IC package assembly method of claim 15, further comprising:
    pressing the pins into solder disposed on the second interconnect pads.

17. The IC package assembly method of claim 16, further comprising
    disposing the solder on the second interconnect pads.

18. The IC package assembly method of claim 15, further comprising
    flip-chip bonding the first chip to the first side of the package substrate.

19. The IC package assembly method of claim 16, further comprising
    mounting a second chip to third interconnect pads disposed on a second side of the PGI.

20. An integrated circuit (IC) package assembly method, comprising:
    receiving an assembly including a pin grid interposer (PGI) forming a frame around a first chip coupled to a first side of a package substrate, the PGI having pins soldered to interconnect pads disposed on the first side of the package substrate, wherein a first dielectric layer is disposed around the interconnect pads on the first side of the package substrate and a second dielectric layer is disposed over a first side of the PGI and, and wherein the second dielectric layer is spaced apart from a sidewall of at least one of the pins by a gap, and wherein the first dielectric layer contacts the second dielectric layer; and
    mounting a second chip to interconnect pads disposed on the PGI.

21. The IC package assembly method of claim 20, wherein mounting the second chip further comprises a BGA process.

22. The IC package assembly method of claim 20, wherein mounting the second chip further comprises a flip-chip process.

* * * * *